United States Patent [19]

Jelks

[11] Patent Number: 4,505,949
[45] Date of Patent: Mar. 19, 1985

[54] THIN FILM DEPOSITION USING PLASMA-GENERATED SOURCE GAS

[75] Inventor: Edward C. Jelks, Dallas, Tex.

[73] Assignee: Texas Instruments Incorporated, Dallas, Tex.

[21] Appl. No.: 603,545

[22] Filed: Apr. 25, 1984

[51] Int. Cl.³ .............................................. B05D 3/06
[52] U.S. Cl. ..................................... 427/38; 427/39; 427/53.1
[58] Field of Search ........................ 427/53.1, 38, 39; 156/643

[56] References Cited

U.S. PATENT DOCUMENTS

| | | | |
|---|---|---|---|
| 3,364,087 | 1/1968 | Solomon et al. | 156/643 |
| 3,419,487 | 12/1968 | Robbins et al. | 427/38 |
| 3,472,679 | 10/1969 | Ing et al. | 427/38 |
| 4,042,006 | 8/1977 | Engl et al. | 427/53.1 |
| 4,183,780 | 1/1980 | McKenna et al. | 427/38 |
| 4,340,617 | 7/1982 | Deutsch et al. | 427/53.1 |
| 4,448,801 | 5/1984 | Fukuda et al. | 427/53.1 |

*Primary Examiner*—John H. Newsome
*Attorney, Agent, or Firm*—Robert O. Groover; James T. Comfort; Carlton H. Hoel

[57] ABSTRACT

An apparatus and method for depositing a layer of a surface-compatible material from the gas phase onto a selected surface area of a substrate body using a plasma adjacent the substrate body to create a source gas which is decomposed by a laser or other source of energy on the selected surface area. The plasma-generated source gas may be varied by changing targets within the plasma or the reactant gases, and the laser energy may cause decomposition of the source gas by photolysis or pyrolysis or a combination of both.

10 Claims, 2 Drawing Figures

THIN FILM DEPOSITION USING PLASMA-GENERATED SOURCE GAS

BACKGROUND OF THE INVENTION

This invention relates to deposition of material from a gas phase onto a substrate surface and, more particularly, to generation of a source gas in proximity of the point of deposition. The deposition may be induced by a laser source of energy.

The deposition of materials from a gaseous phase onto a substrate surface is well known. Indeed, a common technique employs photolithographically produced masks for generating patterned deposits for use in fabricating integrated semiconductor devices. This technique requires multistep processing on a microscopic level. Typically, the technique provides a resolution which is limited by the wavelength of the exposure light, the resolution of the masks, the control and registration by which the masks are positioned during the process, and the subsequent etching and deposition techniques. Thus, the special resolution of the final product is limited by the ability to register and expose the masks, control the mask making process, and control the etching and deposition procedures employing the masks.

To overcome the problems associated with use of masks, methods of directed writing with lasers for deposition on substrates has been proposed. For example, Deutsch et al., U.S. Pat. No. 4,340,617 discloses a method for forming a thin film of material on the substrate surface by a photolytic decomposition of a gaseous compound of the material by laser source energy. The apparatus includes a gas deposition chamber with a jig for supporting the substrate together with a laser source of energy operating at a desired wavelength and optical system for focusing the energy toward the selected surface and at a position adjacent to the selected surface. A gaseous compound of the material to be deposited is introduced into the chamber, and the compound absorbs a portion of the incident laser energy at the selected wavelength which causess photo decomposition of the compound close to the surface, thereby releasing the material for a deposition upon the surface. Organo-metallic gases such as trimethylaluminimum and dimethylcadmium can be photolytically decomposed at wavelengths less than 260 nm. to form aluminum and cadmium deposits. Activation may be by a frequency doubled and continuous wave argon-ion laser operating at 514.5 nm. or, alternatively, a pulsed argon fluoride excimer laser at 193 nm. The photo deposition may occur primarily by photolysis of the van de Waals molecular films on the substrate surface (Brueck et al., 48 Physical Review Letters 1678 (1982)) or in the gaseous phase (Wood et al. 42 Applied Physics Letters 408 (1983)).

Others have employed laser source energy for pyrolytic decomposition of the gaseous compound by heating the substrate surface with the laser source energy. For example, Herman et al., Materials Research Society Symposium Proceedings Volume 17 (1983) briefly compare the ultimate limit on the rate of metal deposition by photolytic and pyrolytic processes and conclude that the low photolytic cross section for a compound such as trimethylaluminum indicates that the pyrolytic decomposition will result in deposition of aluminum metal at approximately three orders of magnitude faster than photolytic decomposition for laser intensities at acceptable levels. Herman also used dimethylcadmium, nickel tetracarbonyl and dimethyl zinc, running, approximately ten Torr of metal alkyl or carbonyl in combination with 700 Torr helium as a buffer.

Others have found need for laser source energy induced deposition or etching in order to fabricate integrated circuits totally by direct writing using a laser beam focused on the substrate surface. For example, Herman et al. Materials Research Society Conference (Boston, Nov. 15, 1983) use tungsten hexafluoride to deposit tungsten, nickel tetracarbonyl to deposit nickel, silane to deposit silicon, phosphine to dope polysilicon, hydrogen chloride and chlorine to etch silicon, and hydrogen fluoride and silicon to remove silicon dioxide, all induced by laser beam pyrolysis, to fabricate a MOS transistor by direct writing.

In all of these prior art uses of laser source energy for photolysis or pyrolysis to effect deposition of a material from a gaseous phase, the material is introduced into the deposition chamber already in compounded form (e.g. aluminum is pumped in as the gaseous trimethyl, and nickel may be introduced as liquid nickel carbonyl which has a partial pressure of several hundred Torr at room temperatures). Introducing source gases directly into the deposition chamber is greatly complicated by the fact that organo metallic compounds are generally highly toxic and sensitive to moisture and air. Also, the fact that only relatively stable compounds can be used limits the choice of materials that can be deposited. In addition, some desirable materials are not commercially available in suitable gaseous form of sufficient purity. In particular, the previously noted small cross section of trimethylaluminum deters use of photolytic deposition of aluminum. Also, the variety of materials that are needed during a single direct writing fabrication process may require many different compounds to be introduced and removed from the deposition chamber, and this presents different handling problems, especially with a volatile liquid such as nickel carbonyl. Thus, there is a need for a flexible and in situ generation of gaseous compounds of the materials to be deposited.

SUMMARY OF THE INVENTION

The invention relates to an apparatus and method for generating gaseous compounds of selected materials, such generation to occur within a deposition chamber and in the vicinity of a substrate surface. The deposition of the material from the generated gaseous compound may be induced by a laser source of energy providing photolytic or pyrolytic decomposition of the gaseous compound at the surface of the substrate.

The invention, in one aspect, relates to an apparatus and method for generation of gaseous compounds of selected materials within a gas deposition chamber by introducing the material as the target in a plasma together with a plasma etching gas for the material. The plasma etching gas is ionized by the plasma and forms reactive species which combine with the target material to form gaseous compounds, possibly unstable and short lived. The gaseous compounds are swept across the substrate surface where the laser or other energy source induces deposition of the desired material.

In a particular embodiment of the invention a remote handling device allows the changing of the target in the plasma so that the gaseous compounds being generated can be quickly and easily changed, thereby permitting deposition of different materials on the substrate surface with little down time.

Thus, the problems of the prior art including the unavailability commercially of suitable gaseous sources for some desirable materials, the difficulty and hazards of handling toxic compounds of the materials in interest, the inability to use short lived compounds of the materials of interest, and the awkwardness of changing materials during the deposition process are overcome.

BRIEF DESCRIPTION OF THE DRAWINGS

Other features and advantages of the present invention will become apparent from the following description of particular embodiments of the invention taken together with the drawings in which.

DETAILED DESCRIPTION OF PREFERRED EMBODIMENTS

Figure 1:
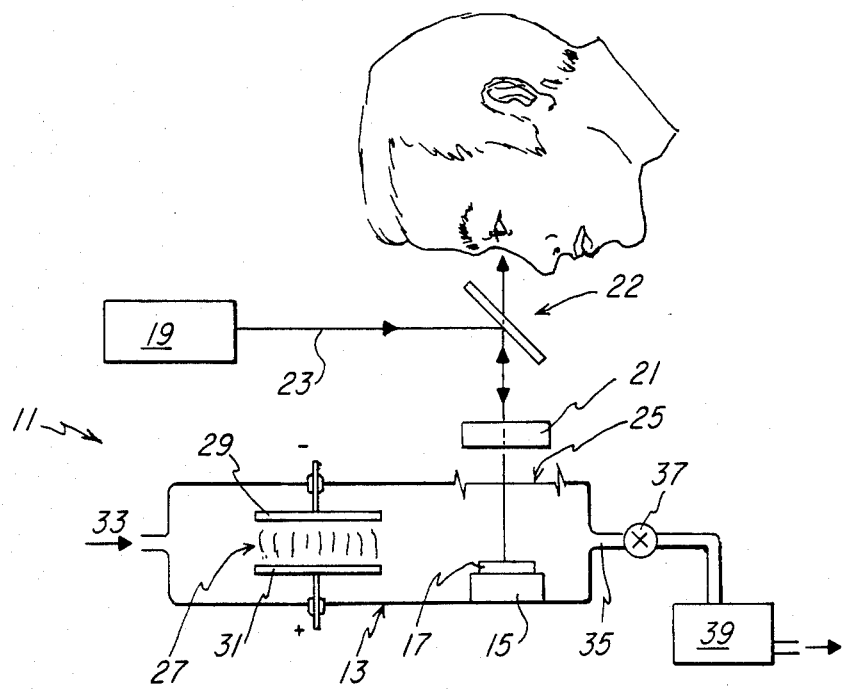
FIG. 1 is a schematic representation of a first preferred embodiment of the inventive apparatus.

Turning now to FIG. 1, a first preferred embodiment apparatus, generally designated 11, includes a reaction chamber 13, a support assembly 15, a substrate 17, a laser source of energy 19, an optical imaging system 21 for focusing or imaging beam 23 produced by laser 19, an optical viewing system 22, window 25 in the walls of chamber 13 for transmission of beam 23 into chamber 13 and into the surface of substrate 17, plasma 27 formed between electrodes 29 and 31, inlet 33, outlet 35, throttling valve 37 and vacuum pump 39. Apparatus 11 operates as follows:

As a first example of the operation of apparatus 11 and use of the method, presume that a metal M, for example tungsten, is to be selectively deposited on the surface of substrate 17 by pyrolysis. First, electrode 31 is formed with a layer of metal M. Next, a gas that will efficiently plasma etch metal M, such as sulphur hexafluoride or carbontetrafluoride in the case of tungsten, is pumped by means of vacuum pump 39 from inlet 33 through chamber 13 and out outlet 35. Throttling valve 37 is used to adjust the chamber pressure so that a dc or rf glow discharge can be established between electrodes 29 and 31 using either a dc power supply or an rf generator. Electrode 29 serves as the cathode. Alternatively, a mixture of gases could be used, such as $O_2$ and $CF_4$ where $O_2$ enhances the production of F species and causes increased etch rates. Once the desired pressure is stabilized, electrodes 29 and 31 are energized and plasma 27 is created. Possible conditions for rf plasma etching of Tungsten are 500 watts rf power at 4.5 MHz, 200 m Torr pressure, 60° C. electrode temperature, and a total flow rate of 75 SCCM (see C. C. Tang and D. W. Hess, Tungsten Etching in $CF_4$ and $SF_6$ Discharges, J. Electrochem. Soc., pp 115-120 (1984)).

Plasma 27 ionizes the etching gas, and the ions bombard the electrodes 29 and 31. This generates volatile species incorporating metal M. For example, $SF_6$ will break down into species such as F− that bombard electrode 31 to form species such as $WF_6$ in the case of Tungsten. The volatile species that serve as a source gas for the subsequent deposition, such as $WF_6$, diffuse out of plasma 27 and are carried over the surface of substrate 17.

The surface of substrate 17 is locally heated where metal M is to be deposited by the laser beam pattern 23 produced by laser 19. Laser beam pattern 23 may be a single focussed spot or a complex pattern generated by using the laser and optical system to image the pattern from a mask to the substrate. Window 25 in chamber 13 is made of material selected to be transparent had the wavelength generated by laser 19. For pyrolytic deposition laser 19 and substrate 17 are chosen so that the thermal conductivity and absorption characteristics of the substrate in conjunction with the wavelength and output power of the laser are capable of producing a sufficient substrate surface temperature to decompose the source gas at reasonable rates. Different substrate and laser characteristics may be required for photolytic deposition (See Deutsch et al., U.S. Pat. No. 4,340,617). Consequently, the source gas flowing across the surface of substrate 17 encounters a surface that is below its decomposition temperature except in the regions illuminated and heated by laser 19. In these regions the source gas decomposes to deposit metal M onto the surface of substrate 17 and a volatile residue is released. For example, $WF_6$ would decompose to $W(solid) + F_2(gas)$. Note that the volatile species formed with metal M and plasma 27 may have short life times yet still be useful because the decomposition reaction for deposition occurs immediately after creation of the source gas.

For the specific case of pyrolytic tungsten deposition using $SF_6$ as the plasma etchant, it is estimated that a partial pressure of from 50 to 100 m Torr of $WF_6$ can be generated using a seven inch diameter tungsten target under the plasma discharge condition described above. This leads to a tungsten deposition rate of approximately 2 to 20 angstroms per second for 600° C. surface temperature (see, Allen et al., J. Appl. Phys. 54 (3), Mar. 1983). It is expected that much higher deposition rates can be achieved with higher substrate temperatures, more efficient plasma reactions, and photolytic driven reactions, Of course, there are many variation on the above embodiment. Some examples are the use of composite targets formed from more than one material, each comprising different areas of the target depending on the nature of the source gas or mixture of source gases required. For example, both $SiF_4$ and $WF_6$ can be generated from a tungsten/silicon target simultaneously for the purpose of depositing $WSi_2$ thin films. The deposition of a great number of other compounds and alloys should be possible using this technique. Deposition of compounds and alloys is also possible by introducing other reactive gases such as nitrogen to form nitrides, for example. Another variation is uniform heating of the substrate to temperatures slightly under decomposition temperatures of the source gases of interest. This allows a much lower laser power to be used in cases where laser power is at a premium. Still another variation is the use of a computer driven x-y stage to support the substrate in conjunction with a focussed laser beam to generated patterns. It also may be desirable, instead of a laser, to use conventional heating sources to decompose the source gases.

There are numerous possible materials that are candidates for deposition with this technique. Some examples are (1) $SF_6$ and $CF_4$ as plasma etchants to generate $WF_6$, $MoF_6$, $NbF_5$, and $SiF_4$, and (2) $CCl_4$ as a plasma etchant to generate $AlCl_3$ and $TiCl_4$. Of course, possible materials for deposition would include not only metals but semiconductors, insulators, and organic materials as well.

Figure 2:
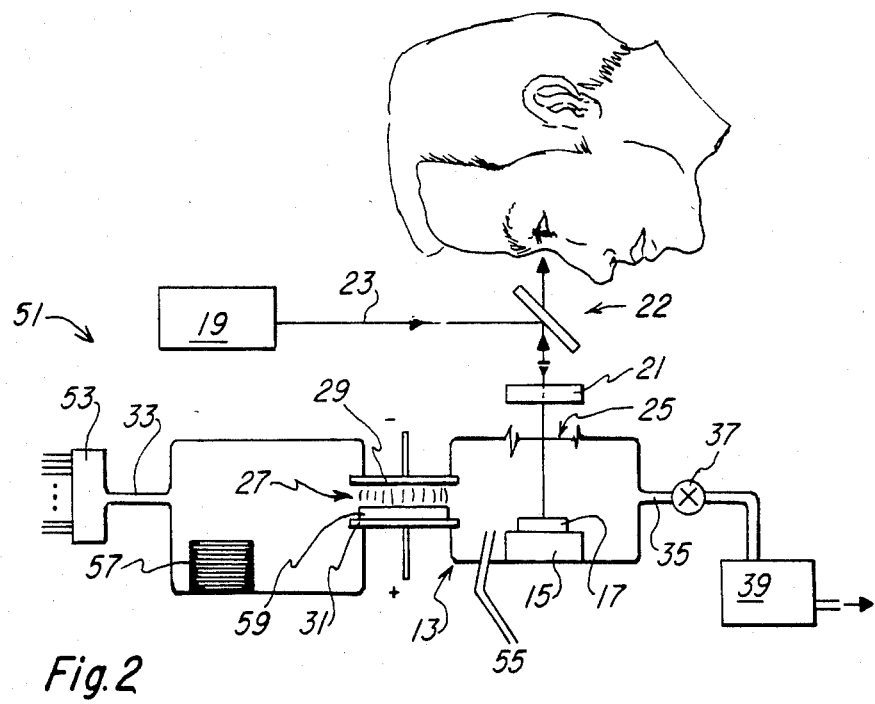
FIG. 2 is a schematic representation of a second preferred embodiment of the inventive apparatus.

A second preferred embodiment apparatus, generally denoted by 51, is schematically represented in FIG. 2 and includes all of the features of the first preferred embodiment apparatus 11 (and which are numbered as in FIG. 1) plus the additional inlet gas manifold 53, secondary inlet 55, and interchangeable electrode stack 57. In general, apparatus 51 operates in the same manner as apparatus 11; however, the additional features provide more flexibility as follows.

Secondary inlet 55 permits the introduction of a reactive gas to aid in the deposition decomposition of the volatile species containing metal M. For example, if metal M is chosen to be tungsten and the plasma etching gas is chosen to be carbon tetrafluoride, then the volatile species may include tungsten hexafluoride. Thus, the introduction of hydrogen through secondary inlet 55 permits a mixture of tungsten hexafluoride and hydrogen to pass over the surface of substrate 17, and the pyrolytic decomposition reaction of $WF_6$ plus $H_2$ yields W (solid) plus HF (gas). In effect, the hydrogen is scavenging the volatile residue of the pyrolytic decomposition. Similarly, other scavenging gases such as oxygen may be introduced through secondary inlet 55.

Electrode stack 57 schematically represents a supply of electrode 31 inserts plus machinery for exchanging inserts with insert 59 on electrode 31. Insert 59 is simply a flat conducting plate in electrical contact with electrode 31 and may be held against electrode 31 by gravity or other means. Of course, insert 59 electrically becomes part of electrode 31 and is the ion bombardment target. This use of insert 59 implies that metal M is to be coated on insert 59 rather than electrode 31 and that metal M can be changed without dismantling chamber 13. Rather, even during processing insert 59 can be removed and replaced by a different insert coated with a different material or combination of materials from stack 57.

A change in metal M may necessitate a change in the plasma etching gas introduced through inlet 33. Such a change is most easily accomplished by the use of inlet gas manifold 53 to select from the various gases connected to the inputs of manifold 53.

Further, the inserts in stack 57 may be refrigerated to avoid contamination yet still permit storage and use of relatively active materials. Indeed, entire deposition chamber 13 may be cryoshielded for low temperature depositions. conversely, substrate 17 may be heated solely by conventional means (no laser) for blanket pyrolytic deposition or for surface selective reactions such as $2WF_6 + 3Si(solid) \rightarrow 2W(solid) + 3SiF_4$.

What is claimed is:

1. A method for depositing a material on a surface of a substrate, comprising the steps of:
    (a) supporting said substrate in a closed chamber,
    (b) forming within said chamber a plasma between two electrodes, at least one of said electrodes having a target surface containing said material,
    (c) introducing a gas into said plasma, said gas characterized by the formation of volatile species of said material when said gas is introduced into a plasma between electrodes at least one of which has a target surface containing said material, and thereby generating said volatile species,
    (d) transporting said volatile species from the vicinity of said target surface to the vicinity of said surface, and
    (e) decomposing said volatile species in the immediate vicinity of said surface to deposit said material on said surface.

2. The method of claim 1, wherein said step of decomposing comprises:
    (a) directing energy from a laser source onto said surface to heat said surface for pyrolytic decomposition of said volatile species.

3. The method of claim 1, wherein said step of decomposing comprises:
    (a) selecting a laser source with an output energy at a wavelength to induce photolytic decomposition of said volatile species, and
    (b) directing said energy into a region adjacent said surface for photolytic decomposition of said volatile species.

4. The method of claim 1, wherein said step of transporting comprises:
    (a) diffusion of said volatile species.

5. The method of claim 1, wherein said step of introducing comprises:
    (a) continuously injecting said gas into said chamber in the vicinity of said plasma, and
    (b) continuously extracting gases from said chamber in the vicinity of said surface.

6. The method of claim 1, further comprising the step of:
    (a) injecting a scavenger gas into said chamber in the vicinity of said surface.

7. An apparatus for depositing a material on a surface of a substrate, comprising:
    (a) a closed chamber;
    (b) a support for said substrate in said chamber; and
    (c) a pair of electrodes in said chamber, said electrodes characterized by the formation of a plasma between them when said electrodes are activated and at least one of said electrodes having a target surface containing said material.

8. The apparatus of claim 7, wherein
    (a) said target surface is on a removable insert.

9. The apparatus of claim 7 further comprising:
    (a) an inlet; and
    (b) an outlet.

10. The apparatus of claim 9, further comprising:
    (a) a pump connected to said outlet.

* * * * *